US006636077B1

(12) United States Patent
Chang et al.

(10) Patent No.: US 6,636,077 B1
(45) Date of Patent: Oct. 21, 2003

(54) HIGH ISOLATION, LOW POWER HIGH SPEED MULTIPLEXER CIRCUIT

(75) Inventors: Charles E. Chang, Thousand Oaks, CA (US); Andre Metzger, La Jolla, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/330,875

(22) Filed: Jun. 11, 1999

(51) Int. Cl.[7] ................... H03K 19/082; H03K 17/62
(52) U.S. Cl. .................... 326/105; 327/407
(58) Field of Search ................... 326/105, 106, 326/107, 108; 327/407, 408, 409, 410, 411, 412, 413

(56) References Cited

U.S. PATENT DOCUMENTS 5,172,011 A * 12/1992 Leuthold et al. ......... 307/272.2
5,959,491 A *  9/1999 Kang ...................... 327/359

OTHER PUBLICATIONS

"Differential Emitter Dotted Multiplexor", IBM Technical Disclosure Bulletin, vol. 37, No. 2A, Feb. 1, 1994, p. 177–178.

* cited by examiner

Primary Examiner—Daniel Chang
(74) Attorney, Agent, or Firm—Keith Kind; Kelly H. Hale

(57) ABSTRACT

A high-isolation, low-power high-speed multiplexer circuit suitably includes a buffer stage and a current steering tree stage. By employing common select lines for both stages of the circuit, both the input buffer and the deselected channel provide cumulative isolation for the deselected channels.

8 Claims, 4 Drawing Sheets

HIGH ISOLATION, LOW POWER HIGH SPEED MULTIPLEXER CIRCUIT

BACKGROUND OF THE INVENTION

1. Technical Field

The present invention relates, generally, to multiplexer circuits useful in the context of high speed data switches and, more particularly, to a multiplexer circuit topology which yields high isolation of the deselected channels, thereby reducing jitter at high switching speeds while at the same time reducing power consumption.

2. Background Art and Technical Problems

The increasing proliferation of high speed data traffic in both long-haul and short-haul communication networks requires increasingly reliable high speed crosspoint switches. Crosspoint switches are particularly valuable in that they enable the communication network to be reconfigured to accommodate changing traffic requirements and response to high-priority messages. High speed crosspoint switches are also increasingly being cascaded together to form larger and larger high speed switching networks.

As the switching speed and complexity of high speed communication networks continues to increase, jitter becomes increasingly problematic. Presently known attempts to limit the jitter associated with these switches impedes the speed of the switch or the ability of the switch to broadcast any input to multiple outputs when required.

High speed crosspoint switches are thus needed which minimize jitter, while at the same time reduce cross talk between the channels on the chip.

SUMMARY OF THE INVENTION

In accordance with an exemplary embodiment of the present invention, a two stage multiplexer circuit is provided having a buffer stage and a multiplexer stage. By employing common select lines for both stages of the circuit, both the input buffer and the deselected channel provide cumulative isolation for the deselected channels.

In accordance with a particularly preferred embodiment, a dedicated differential buffer is associated with each input channel. An active channel receives power and suitably provides a selected signal to the output of the switch. The inactive channels and their associated buffers are suitably de-powered such that enhanced isolation of the deselected buffers with respect to the output terminal may be achieved. Moreover, by powering down the deselected channels, the multiplexer circuit consumes substantially less power than presently known switches.

In accordance with a further aspect of the present invention, a high isolation, low power multiplexer circuit may be conveniently implemented in aluminum gallium arsenide/gallium arsenide (AlGaAs/GaAs) HBT IC technology available from the Connexant corporation of Newberry Park, Calif. Alternatively, the invention may be suitably implemented with any form of bipolar or high speed MOS technology.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EXEMPLARY EMBODIMENTS

Figure 1A:
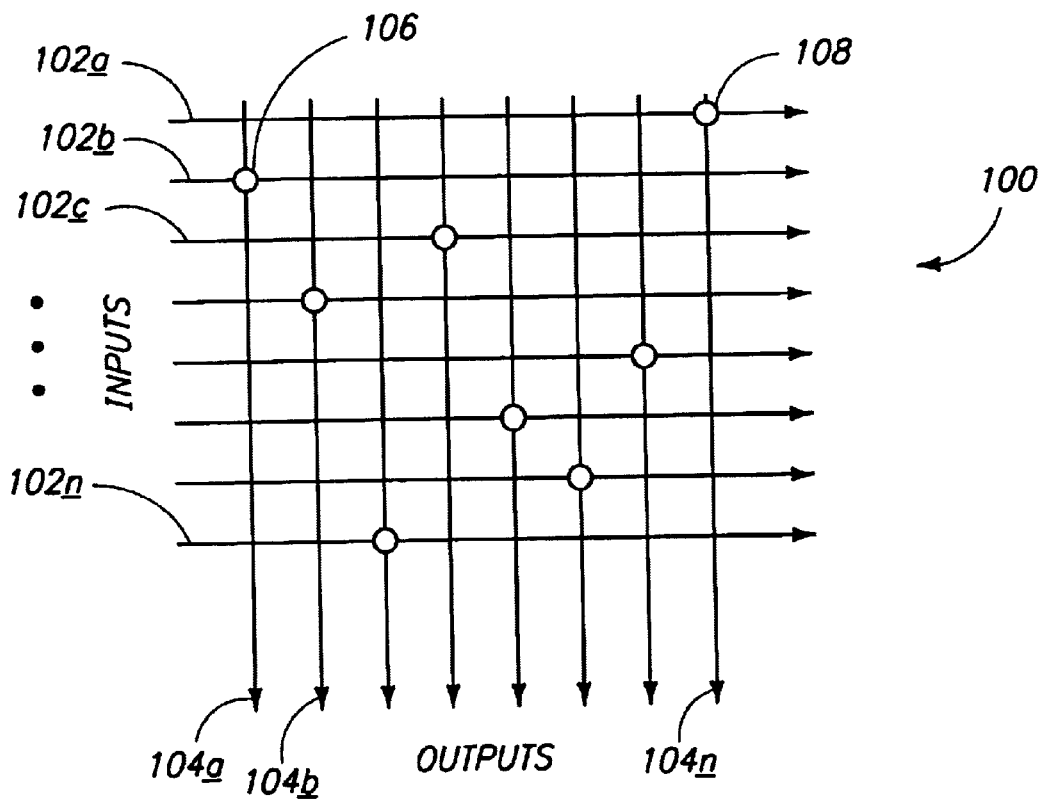
FIG. 1a is an exemplary schematic representation of a typical crosspoint switch.

Referring now to FIG. 1a, a crosspoint switch 100 is shown having a plurality of input lines 102a . . . 102n and a plurality of output lines 104a . . . 104n. This configuration is classically referred to as an N×N crosspoint switch that is suitably configured to allow the multiplexer to select any input to be transmitted to one, all, or none of the outputs without regard to the other signals: in the classical implementation, however, no single output directs more than one input. The various dots (e.g., intersection 106 and intersection 108) represent an input/output intersection.

For example, of the various input signals 102a–102n which can be directed to output line 104a, switch 100 is shown in the illustrated embodiment of FIG. 1 as applying input 102b to output line 104a, with the intersection between input 102b and output 104a represented by intersection dot 106. Similarly, output 104n is capable of providing any one of input signals 102a–102n as selected by the multiplexer (not shown). In the illustrated embodiment, output line 104n is selected to transmit input signal 102a, as indicated by intersection dot 108. Thus, for output line 104n, input channel 102a is the "selected" channel, and input channels 102b–102n are referred to as the "deselected" channels for output line 104n. Similarly, for output line 104a, input channel 102b is the "selected" channel, while input channels 102a and 102c–102n are the. "deselected" channels for output line 104a.

Figure 1B:
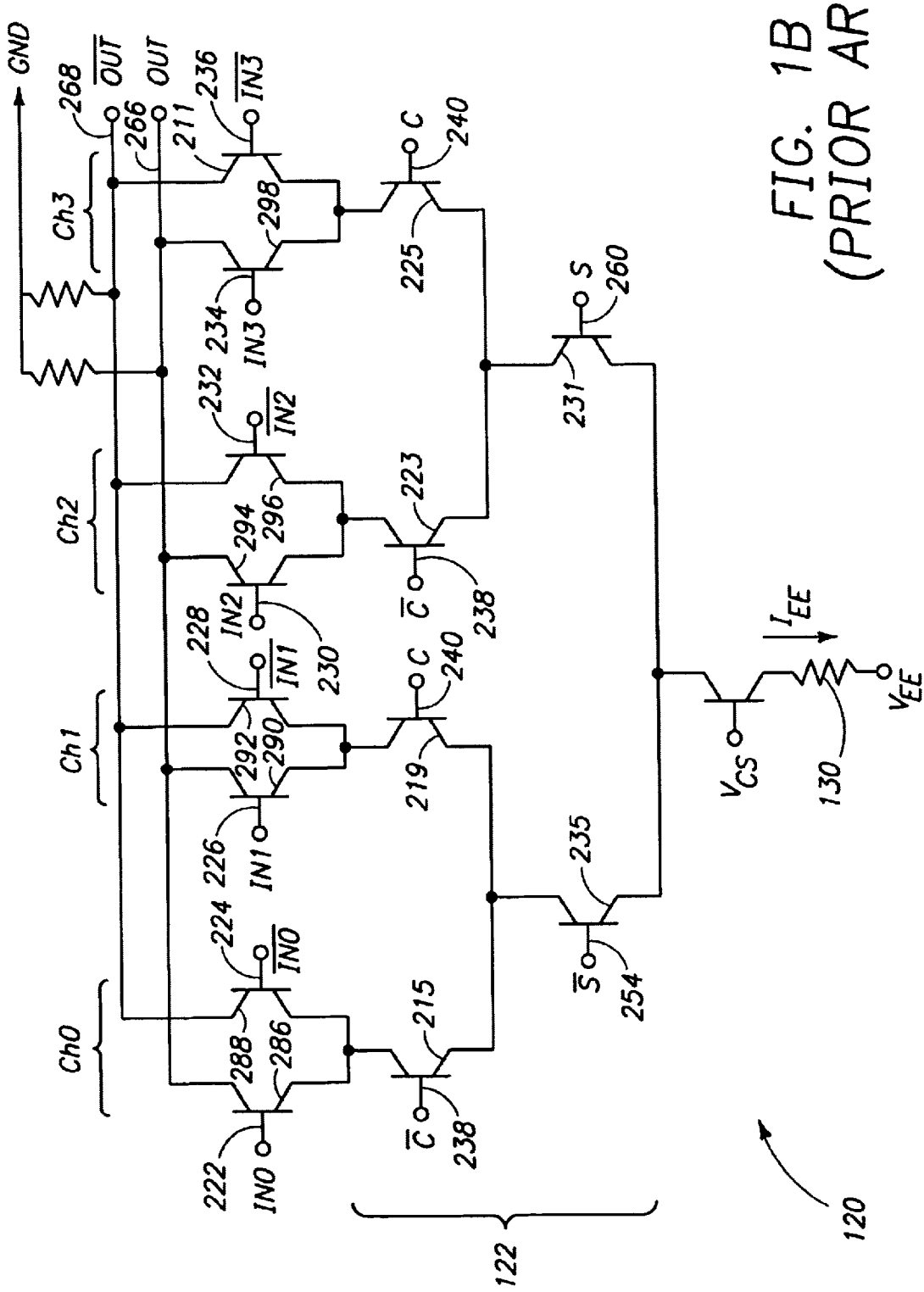
FIG. 1b is an exemplary schematic circuit diagram of a prior art multiplexer.

Referring now to FIG. 1B a simple four-to-one multiplexer 120 is shown. Multiplexer 120 suitably includes four input channels shown as Ch0, Ch1, Ch2, and Ch3 in the diagram. Each input channel preferably includes an input transistor receiving an input signal (signals 222, 226, 230, or 234 for channels Ch0, Ch1, Ch2 and Ch3, respectively) and a corresponding transistor receiving an inverted input signal (signals 224, 228, 232, and 236, respectively). A particular channel of the multiplexer 120 is suitably selected through a tree 122 of control transistors. The control transistors select the proper channel based upon inputs C and S, as disclosed more fully below. An important function of the select tree 122 is to provide a proper path for bias current $I_{EE}$ across the selected input channel. For example, when C and S are both logic low, channel Ch0 is selected and bias current $I_{EE}$ (defined as applied bias voltage $V_{EE}$ applied across resistor 130) is provided to transistors 286 and 288. Because input signals 222 or 224 are logic inverts of each other, either signal 222 or signal 224 must be logically high. The output signal 266 or 268 corresponding to the high input signal is also high, and the other output signal (corresponding to the low input signal) is necessarily low. In this manner each of the transistors used in the input channel are suitably connected to a common output channel 266 or 268, as applicable. Likewise control signals C and S are suitably connected and configured to each channel through the selection tree 122.

With continued reference to FIGS. 1a and 1b, although only a unique one of high speed input channels 102a–102n is selected by each output line for a particular switch cycle, the remaining deselected input channels nonetheless present a high speed data signal to the various multiplexer transistors associated with each input line. In a typical bipolar transistor implementation, the base-collector capacitance ($C_{bc}$) of the deselected transistors provides one level of impedance isolation, for example on the order of 20 dB of isolation. At higher switching speeds, the impedance associated with this base-collector capacitance is reduced in accordance with the following relationship:

$$Z = \frac{1}{j\omega C}$$

where Z is the impedance of the base-collector junction, ω is the switching frequency, and c is the value of the base-collector capacitance. The imaginary j indicates that the response is a function of frequency (f) in radians/second such that ω=2πf. At high switching speeds (corresponding to lower base-collector impedance), the deselected channels apply an attenuated signal to the output line that tends to randomly modulate the differential cross-over point of the multiplexer's output, thus resulting in unwanted jitter. For larger multi multiplexers, for example when crosspoint switches are cascaded in larger communication networks, the jitter problem becomes exacerbated.

Figure 2:
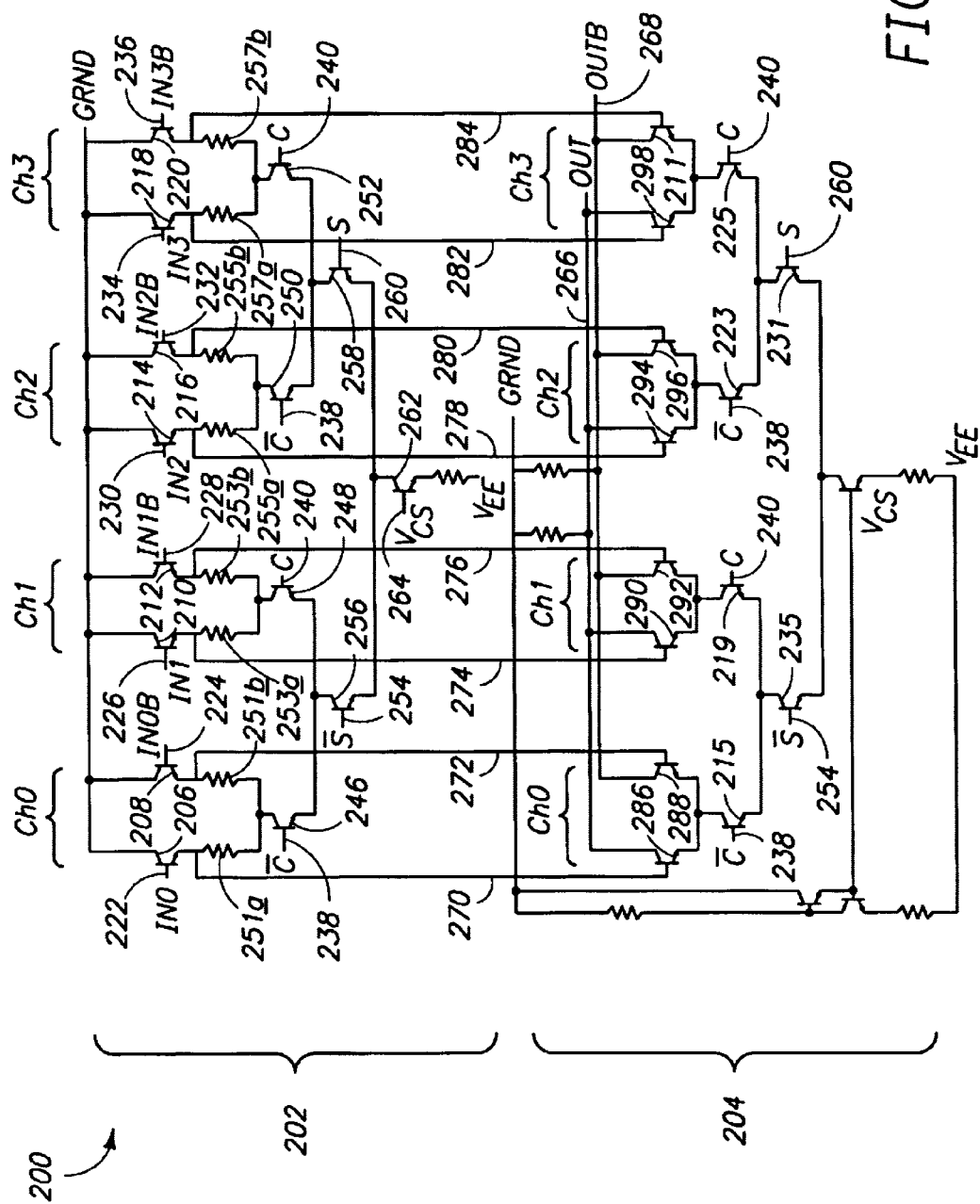
FIG. 2 is an exemplary schematic circuit diagram of a preferred embodiment of the present invention, showing a first buffer stage and a second multiplexer stage.

Referring now to FIG. 2, a preferred embodiment of a high isolation, high speed lower power multiplexer 200 suitably comprises a first buffer-isolation stage 202 and a second multiplexer stage 204. Buffer stage 202 suitably comprises a dedicated buffer for each input channel of the multiplexer. In preferred embodiments, buffer stage 202 is a selectable differential emitter-follower buffer (SDEF). In alternative embodiments, any suitable buffer configuration may be employed, for example a differential amplifier, emitter-follower buffer, or the like. In the illustrated embodiment, unique buffer circuitry is employed as the driver for each input channel of the multiplexer, as discussed in greater detail below.

With continued reference to FIG. 2, a first multiplexer channel (channel Ch0) comprises respective complimentary transistors 286 and 288; a second input channel (channel Ch1) suitably comprises respective complimentary transistors 290 and 292; a third channel (channel Ch2) suitably comprises respective complimentary transistors 294 and 296; and a fourth channel (channel Ch3) suitably comprises respective complimentary transistors 298 and 211. A first buffer pair associated with channel 0 suitably comprises respective differential transistors 206 and 208; a second buffer pair associated with channel Ch1 suitably comprises respective differential transistors 210 and 212; a third buffer pair associated with channel Ch2 suitably comprises respective transistors 214 and 216; and a fourth buffer pair associated with channel Ch3 suitably comprises respective transistors 218 and 220.

With continued reference to input buffer stage 202 of high isolation multiplexer circuit 200, input signal IN0 222 is suitably applied to the base of transistor 206, and input signal IN0bar 224 is suitably applied to the base of transistor 208. In similar fashion, channel 1 inputs IN1 226 and IN1bar 228 are suitably applied to the bases of transistors 210 and 212, respectively; with respect to channel 2, input signals IN2 230 and IN2bar 232 are applied to the bases of transistors 214 and 216, respectively; and with respect to channel 3, input signals IN3 234 and IN3bar 236 are applied to the bases of transistors 218 and 220, respectively.

In accordance with one aspect of the present invention, a current steering tree is used to power up the input buffer and the input channel for the selected input, while at the same time powering down the deselected channels and their associated input buffers. In accordance with a particularly preferred embodiment of the present invention, the current steering tree involves the use of the same common control and select lines for both the input buffer stage 202 and the multiplexer stage 204, as described in greater detail below. In further accordance with a particularly preferred embodiment of the present, the same control and select signals described with respect to input buffer stage 202 are also employed to control the powering up of the selected channel of multiplexer stage 204 and to power down the deselected channels of multiplexer 204.

At the input buffer stage 202, the current steering tree in accordance with the illustrated embodiment of the present invention suitably comprises common control signal Cbar 238 applied to the bases of control transistors 246 and 250. Common control signal C 240 is suitably applied to the bases of control transistors 248 and 252. Select line Sbar 254 is shown applied to the base of a select transistor 256, and corresponding S signal 260 suitably to the base of transistor 258. Operating power $V_{EE}$ generating bias current $I_{EE}$ is shown supplied to the aforementioned select circuit via transistor 262, which is suitably maintained in the on position by applying $V_{CS}$ signal 264 to the base of transistor 262.

With continued reference to FIG. 2, the aforementioned control signal 238 is suitably applied to respective control transistors 215 and 223 associated with multiplexer 204; signal C 240 is suitably applied to respective control transistors 219 and 225 associated with multiplexer stage 204. In addition, signal Sbar 254 is suitably applied to the base of transistor 235 associated with multiplexer 204, and signal S 260 is suitably applied to the base of transistor 231, also associated with multiplexer 204.

As discussed briefly above, control signal C 240 and select signal S 260 (and complimentary signals Cbar 238 and Sbar 254) are suitably employed to simultaneously power up the selected channel (and its associated input buffer) and at the same time power down the deselected channels (and their associated input buffers). In this way, logic control circuitry associated with the current steering tree is minimized, while at the same time reducing the power requirement of the overall circuit inasmuch as all of the deselected channels and their associated buffers are powered down. Significantly, by powering down both the deselected control or current steering transistors and the transistors associated with the deselected channel buffers, enhanced isolation of the base-collector junction of the deselected transistors is achieved. In particular, a first level of isolation, for example on the order of −18 to −20 dBs with HBT technology, is achieved by powering down the transistor associated with the deselected channel, and a second, cumulative isolation is achieved by powering off the buffer transistor of the associated deselected channel. The manner in which these objectives are achieved will now be described.

With continued reference to FIG. 2, the control and select signals are configured to select one of channels Ch0–Ch3 in the illustrated embodiment in accordance with the following relationship:

TABLE 1

|  | S | C |
|---|---|---|
| Ch0 | 0 | 0 |
| Ch1 | 0 | 1 |

TABLE 1-continued

|     | S | C |
|-----|---|---|
| Ch2 | 1 | 0 |
| Ch3 | 1 | 1 |

In this regard, although a 4:1 multiplexer is shown in the illustrated embodiment, it will be appreciated that the present invention may be employed in the context of-virtually any multiplexer of any desired dimension of input channels and output lines, to the extent it is desired to improve the isolation of the deselected channels with respect to the output line.

With continued reference to FIG. 2, the manner in which Channel Ch0 may be selected and applied to the output of multiplexer 200 will now be described. In accordance with Table 1, Channel Ch0 may be selected by applying a logic low control signal and a logic low select signal to the current steering tree. Referring now to the first stage 202, with a logic low control signal Cbar 238, transistors 246 and 250 are turned on, and transistors 248 and 240 are turned off (it being understood that signal Cbar 238 is the logical inverse of signal C 240; similarly, the logic level of select level Sbar 254 is always the opposite of the logic level of select signal 260). With transistors 248 and 252 turned off, the buffers associated with Channels 1 and 3 are also turned off (i.e. powered down).

More particularly, with momentary reference to the Channel 1 buffer, with transistor 248 turned off, the emitters of transistors 210 and 212 are both terminated at an open circuit; thus, no voltage can be developed across either resistor 253a or resistor 253b. With no voltage across these resistors, no current is present in either of respective interconnect lines 274 or 276. Thus, input transistors 290 and 292 have no signal applied, which isolates the output line 266 (and OUTB line 268) from the deselected CH1.

With momentary reference to the buffer associated with Channel 3, with a high logic control signal Cbar 238, signal C 240 will be low, turning off transistor 252, such that respective transistors 218 and 220 are effectively coupled to an open circuit, such that no voltage drop is developed across either of respective resistors 257a and 257b. As a result, respective interconnect lines 282 and 284 keep the input to the respective multiplexer transistors 298 and 211 such that the transitors are turned off, effectively deselecting Channel 3 and removing cross-talk through the base-collector junction of transistor 298 from output line 266 (and also removing the feedthrough from the base-collector junction of transistor 211 from OUTB line 268).

Referring now to multiplexer stage 204, with a high logic level control signal Cbar 238, signal C 240 is low such that transistors 219 and 225 are turned off. With transistor 219 turned off, the emitters of transistors 290 and 292 are effectively coupled to an open circuit, providing further isolation of output line 266 from any signals arriving to transistor 290. Further isolation is also provided between signals at transistor 292 and OUTB line 268. Similarly, with transistor 225 turned off, signals at transistor 298 are further isolated from output line 266 (and signals at transistor 211 are further isolated from OUTB line 268).

It can thus be seen that with a high logic level control signal 238 (and a corresponding low logic Cbar signal 240), no bias current is supplied to transistors 290 and 298, providing a first level of isolation between these channels and output line 266. In order to provide enhanced isolation of Channels 1 and 3 with respect to output line 266, bias current is also removed from the emitters of transistors 290 and 298 (as well as the emitters of complimentary transistors 292 and 211) by also turning off respective control transistors 219 and 225.

With control signal Cbar 238 in the logic high condition, as discussed above, Channels 1 and 3 are deselected. The determination as to whether Channel 0 or Channel 2 is selected with a logic high control signal is determined by the logic level of select signal S 260 (and corresponding signal Sbar 254). In particular, with a logic high control signal Cbar 238, Channel 0 is selected and Channel 2 is deselected when select signal Sbar 254 is high; on the other hand, Channel 2 is selected and Channel 0 is deselected when select signal Sbar 254 is in the logic low condition and select signal S is in the logic high condition.

More particularly, with a logic low control signal C 240 and a logic low select signal 260, transistor 258 is turned off and transistor 256 is turned on. With transistor 258 turned off, respective transistors 214 and 216 associated with Channel 2 are effectively coupled to an open circuit (regardless of whether transistor 250 is turned on or off). Thus, with transistor 258 turned off, no voltage is developed across respective resistors 255a and 255b, and as a result no current is developed in either interconnect lines 278 or 280. Consequently, signals to respective transistors 294 and 296 associated with Channel 2 are turned off, providing a first level of isolation between the Channel 2 input signal and output line 266. The Channel 2 inputs are further isolated from output line 266 (and OUTB line 268) when select signal Sbar 254 is high, because select signal S 260 (being logic low) turns off select transistor 231, such that the emitter of transistor 294 (as well as the emitter of transistor 296 is effectively opened to an open circuit, regardless of whether transistor 223 is off or on (i.e., regardless of whether control signal 238 is logic high or logic low). It can thus be seen that Channel 2 is deselected when select signal S 260 is low.

Having established that Channels 1, 2 and 3 are isolated from output line 266 when select signal S 260 and control signal C 240 are high, it remains to be demonstrated that Channel 0 is selected when select signal S 260 and control signal C 240 are logic low.

As discussed above, with control signal Cbar 238 in a logic high condition, transistor 246 is turned on. With select signal Sbar 254 also in the logic high condition, transistor 256 is also turned on. Consequently, a current path from ground to the power source $V_{EE}$ is established through either transistor 206 or transistor 208; the determination of whether 206 or 208 is turned on is, of course, determined by the Channel 0 input data. That is, if input signal IN0 222 is logic high, transistor 206 is on and transistor 208 is off (recall that IN0bar signal 224 is necessarily logic low when IN0 signal 222 is logic high, and vice versa). In contrast, when input signal IN0 222 is logic low, transistor 206 is off and transistor 208 is on inasmuch as IN0bar signal 224 is high when input IN0 222 is low. Thus, when one of transistors 206 and 208 is on (and when control signal Cbar 238 and select signal Sbar 254 are high), a voltage is developed across one or the other of respective resistors 251a and 251b. Accordingly, one of interconnect lines 270 and 272 (as a function of the logic level of the Channel 0 input signal) will carry current. In the case where input IN0 222 is high, transistor 286 is on and transistor 288 is off. With transistor 286 on, and with transistors 215 and 235 turned on as a result of the high logic levels of control signal 238 and select signal 254, a signal path is established through transistor 286 to output line 266, thereby selecting Channel 0 at output line 266.

Again referring to Table 1, and in view of the foregoing discussion, it can be seen that any one of channels Ch0–Ch3 may be uniquely selected by control signal 240 and select signal 260. Significantly, by simply selecting the logic level of each of control signal 238 and select signal 254, all of the other deselected channels are isolated from output line 266 (and OUTB line 268). In accordance with the present invention, the deselected channels have enhanced isolation with respect to the output line inasmuch as the signals are removed from the bases of the transistors associated with the deselected channels; moreover, the "data" signal is also open circuited at the emitter of each transistor of each deselected channel.

Figure 3:
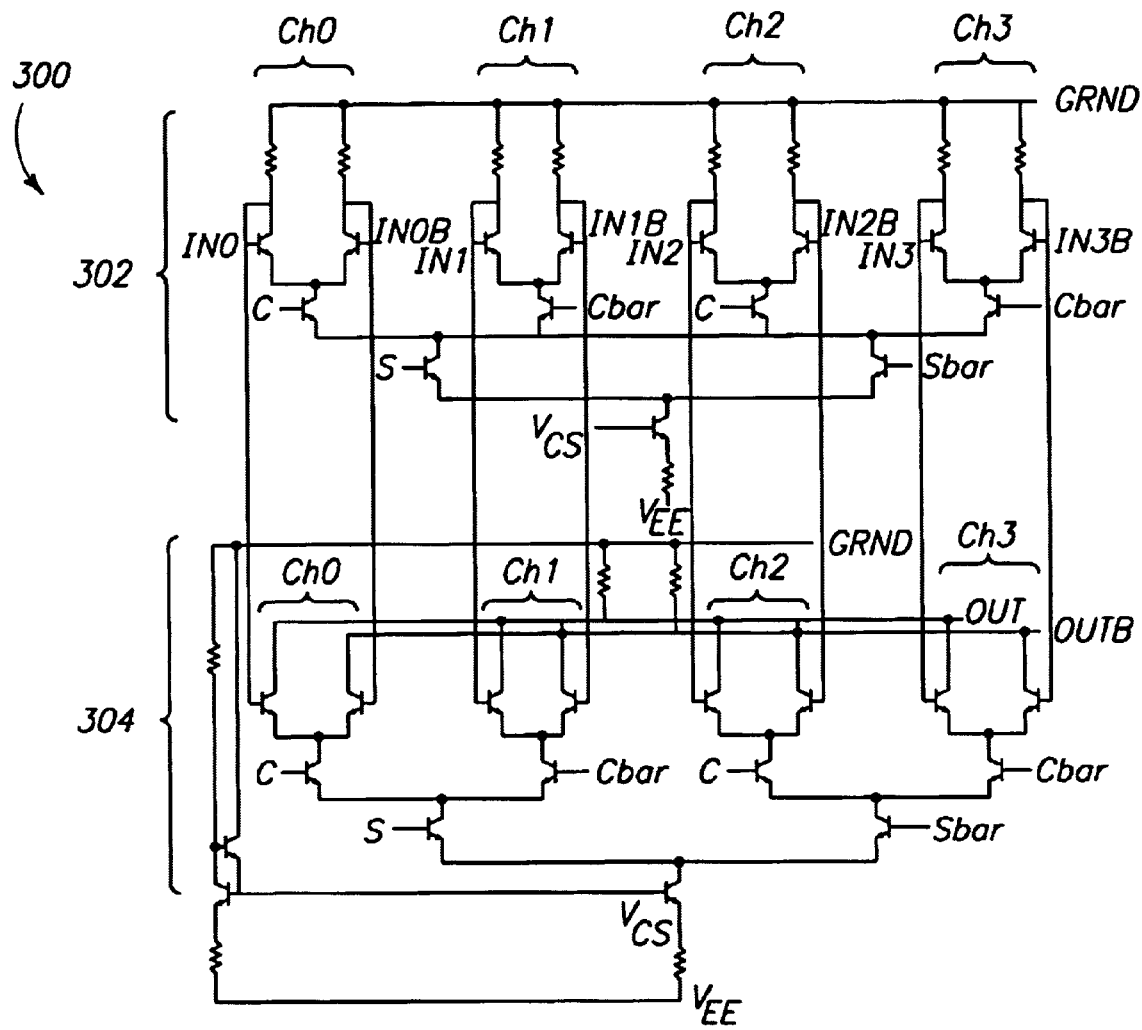
FIG. 3 is an alternative embodiment of the two stage multiplexer circuit shown in FIG. 2.

Referring now to FIG. 3, an alternate embodiment of the present invention suitably comprises a high isolation, low power multiplexer 300 comprising an input buffer stage 302 and a multiplexer stage 304, with the input buffer stage being implemented using a differential pair implementation as opposed to the unique hybrid emitter-follower differential pair described above in conjunction with FIG. 2. The high isolation multiplexer set forth in FIG. 3 functions in essentially the same manner as described above with respect to FIG. 2; FIG. 3 illustrates, however, that the present invention may be implemented in the context of virtually any desired input buffer topology.

The corresponding structures, materials, acts and equivalents of all elements in the claims below are intended to include any structure, material or acts for performing the functions in combination with other claimed elements as specifically claimed. The scope of the invention should be determined by the appended claims and their legal equivalents, rather than by the examples given above.

We claim:

1. A high isolation, low power multiplexer circuit for connecting a particular input data line of a plurality of input data lines to an output data line, the multiplexer circuit comprising:

an input buffer stage including a plurality of input buffers corresponding to the plurality of input data lines;

a first current steering tree connected to the input buffer stage and configured to apply a first control signal set to the input buffer stage, with the first control signal set including first signals and first inverted signals and operative to enable a particular input buffer corresponding to the particular input data line;

a multiplexer stage connected to the input buffer stage and including a plurality of multiplexer elements corresponding to the plurality of input buffers, with a multiplexer element of the plurality of multiplexer elements comprising intersection transistors that are connected to the output data line, with the intersection transistors corresponding in number to second signals and second inverted signals of a second control signal set; and a second current steering tree connected to the multiplexer stage and configured to apply the second control signal set to the multiplexer stage, with the second control signal set including the second signals and the second inverted signals and operative to connect the particular input buffer to the output data line;

wherein the first current steering tree and the second current steering tree connect the particular input data line to the output data line, and wherein the first current steering tree and the second current steering tree isolate all non-selected input lines from the output data line by powering down all non-selected input buffers and powering down all non-selected multiplexer elements.

2. The multiplexer circuit of claim 1, wherein the input buffer stage and the multiplexer stage are implemented with bipolar transistors.

3. The multiplexer circuit of claim 1, wherein the input buffer stage and the multiplexer stage are implemented with high speed metal oxide semiconductor (MOS) transistors.

4. The multiplexer circuit of claim 1, wherein the first current steering tree and the second current steering tree comprise one common current steering tree and the first control signal set and the second control signal set comprise one common control signal set.

5. A method of forming a high isolation, low power multiplexer circuit for connecting a particular input data line of a plurality of input data lines to an output data line, the method comprising:

providing an input buffer stage including a plurality of input buffers corresponding to the plurality of input data lines;

providing a first current steering tree connected to the input buffer stage and configured to apply a first control signal set to the input buffer stage, with the first control signal set including first signals and first inverted signals and operative to enable a particular input buffer corresponding to the particular input data line;

providing a multiplexer stage connected to the input buffer stage and including a plurality of multiplexer elements corresponding to the plurality of input buffers, with a multiplexer element of the plurality of multiplexer elements comprising intersection transistors that are connected to the output data line, with the intersection transistors corresponding in number to second signals and second inverted signals of a second control signal set; and providing a second current steering tree connected to the multiplexer stage and configured to apply the second control signal set to the multiplexer stage, with the second control signal set including the second signals and the second inverted signals and operative to connect the particular input buffer to the output data line;

wherein the first current steering tree and the second current steering tree connect the particular input data line to the output data line, and wherein the first current steering tree and the second current steering tree isolate all non-selected input lines from the output data line by powering down all non-selected input buffers and powering down all non-selected multiplexer elements.

6. The method of claim 5, wherein the input buffer stage and the multiplexer stage are implemented with bipolar transistors.

7. The method of claim 5, wherein the input buffer stage and the multiplexer stage are implemented with high speed metal oxide semiconductor (MOS) transistors.

8. The method of claim 5, wherein the first current steering tree and the second current steering tree comprise one common current steering tree and the first control signal set and the second control signal set comprise one common control signal set.

* * * * *